(12) United States Patent
Chou et al.

(10) Patent No.: US 8,461,613 B2
(45) Date of Patent: Jun. 11, 2013

(54) LIGHT EMITTING DEVICE

(75) Inventors: Hsi-yan Chou, Taipei (TW); Hwa Su, Taipei (TW); Yi-Qun Li, Danville, CA (US)

(73) Assignee: InterLight Optotech Corporation, Taoyuang (TW)

( * ) Notice: Subject to any disclaimer, the term of this patent is extended or adjusted under 35 U.S.C. 154(b) by 431 days.

(21) Appl. No.: 12/127,749

(22) Filed: May 27, 2008

(65) Prior Publication Data

US 2009/0294780 A1 Dec. 3, 2009

(51) Int. Cl.
*H01L 25/03* (2006.01)

(52) U.S. Cl.
USPC .......... 257/99; 257/88; 257/98; 257/E33.058; 257/E33.061

(58) Field of Classification Search
USPC ........................................... 257/99
See application file for complete search history.

(56) References Cited

U.S. PATENT DOCUMENTS

| | | | |
|---|---|---|---|
| 5,298,768 A * | 3/1994 | Okazaki et al. | 257/81 |
| 5,635,115 A * | 6/1997 | Konishi et al. | 264/1.7 |
| 5,998,925 A | 12/1999 | Shimizu | |
| 6,060,729 A * | 5/2000 | Suzuki et al. | 257/99 |
| 6,118,639 A | 9/2000 | Goldstein | |
| 6,949,772 B2 * | 9/2005 | Shimizu et al. | 257/99 |
| 7,621,654 B2 * | 11/2009 | Nishimoto et al. | 362/241 |
| 2003/0102810 A1 * | 6/2003 | Cross et al. | 315/74 |
| 2004/0080941 A1 | 4/2004 | Jiang et al. | |
| 2005/0063187 A1 * | 3/2005 | Weng et al. | 362/296 |
| 2005/0237739 A1 | 10/2005 | Lee et al. | |
| 2006/0027786 A1 | 2/2006 | Dong et al. | |
| 2006/0028122 A1 | 2/2006 | Wang et al. | |
| 2006/0145123 A1 | 7/2006 | Li et al. | |
| 2006/0158090 A1 | 7/2006 | Wang et al. | |
| 2006/0252169 A1 * | 11/2006 | Ashida | 438/29 |

(Continued)

FOREIGN PATENT DOCUMENTS

| | | |
|---|---|---|
| EP | 1 553 641 A1 | 7/2005 |
| WO | WO 2006/080609 A1 | 8/2006 |

(Continued)

OTHER PUBLICATIONS

International Search Report and Written Opinion dated Jul. 21, 2009 for International Application No. PCT/US2009/043713.

*Primary Examiner* — Calvin Lee
*Assistant Examiner* — Abul Kalam
(74) *Attorney, Agent, or Firm* — CKC & Partners Co., Ltd.

(57) ABSTRACT

A light emitting device comprises: a plurality of light emitting diodes and an insulating (low temperature co-fired ceramic) substrate with an array of recesses each for housing a respective one of the light emitting diodes. The substrate incorporates a pattern of electrical conductors that is configured for connecting the light emitting diodes in a selected electrical configuration and to provide at least two electrical connections on the floor of each recess. Light emitting diodes can be electrically connected to the electrical connections by at least one bond wire or by flip chip bonding. Each recess is filled with a transparent material to encapsulate each light emitting diode. The transparent material can incorporate at least one phosphor material such that the device emits light of a selected color and/or color temperature.

14 Claims, 13 Drawing Sheets

U.S. PATENT DOCUMENTS

| | | |
|---|---|---|
| 2006/0261309 A1 | 11/2006 | Li et al. |
| 2007/0029526 A1 | 2/2007 | Cheng et al. |
| 2007/0046169 A1 | 3/2007 | Maeda et al. |
| 2007/0138500 A1 | 6/2007 | Sakai et al. |
| 2007/0189007 A1* | 8/2007 | Nishimoto et al. ........... 362/227 |
| 2007/0257601 A1 | 11/2007 | Erchak et al. |
| 2007/0273299 A1 | 11/2007 | Miskin et al. |
| 2008/0017871 A1* | 1/2008 | Lee et al. ........................ 257/88 |
| 2008/0179618 A1* | 7/2008 | Cheng ............................ 257/99 |

FOREIGN PATENT DOCUMENTS

| | | |
|---|---|---|
| WO | WO 2006/095949 A1 | 9/2006 |
| WO | WO 2007/001116 A1 | 1/2007 |
| WO | WO 2007/018360 A1 | 2/2007 |
| WO | WO 2007/018390 A1 | 2/2007 |
| WO | WO 2007/018401 A1 | 2/2007 |
| WO | WO 2007/083884 A1 | 7/2007 |
| WO | WO 2007/083885 A1 | 7/2007 |
| WO | WO 2008/038910 A1 | 4/2008 |

* cited by examiner

LIGHT EMITTING DEVICE

BACKGROUND OF THE INVENTION

1. Field of the Invention

This invention relates to a light emitting device based on a plurality of light emitting diodes (LEDs). In particular, although not exclusively, the invention concerns an alternating current (AC) driven light emitting device that can be operated from a high voltage (110/220V) supply. Moreover, the invention concerns AC light sources based on a plurality of such light emitting devices.

2. Description of the Related Art

As is known LEDs are intrinsically direct current (DC) devices that will only pass an electrical current in a single direction and have traditionally been driven by low voltage (e.g. 3.5V for gallium nitride LEDs) DC sources.

White light generating LEDs, "white LEDs", are a relatively recent innovation and offer the potential for a whole new generation of energy efficient lighting systems to come into existence. It is predicted that white LEDs could replace incandescent, fluorescent and compact fluorescent light sources due to their long operating lifetimes, potentially many 100,000 of hours, and their high efficiency in terms of low power consumption. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photo-luminescent materials, which absorb a portion of the radiation emitted by the LED and re-emit radiation of a different color (wavelength). Typically, the LED chip or die generates blue light and the phosphor(s) absorbs a percentage of the blue light and re-emits yellow light or a combination of green and red light, green and yellow light or yellow and red light. The portion of the blue light generated by the LED that is not absorbed by the phosphor is combined with the light emitted by the phosphor to provide light which appears to the human eye as being nearly white in color.

In lighting applications it is desirable to be able to operate white LEDs directly from a high voltage (110/250V) AC mains power supply without the need for expensive power supplies and driver circuitry. US 2004/0080941 discloses a single-chip integrated LED that is for direct use with a high voltage (110V/220V) AC power supply that comprises two arrays (strings) of series-connected individual LEDs. The strings are connected in parallel with the LEDs in opposite polarity in a half-wave rectifier configuration such that the LEDs are self-rectifying. A sufficient number of LEDs (e.g. twenty eight per string for 110V operation and fifty five per string for 220V operation) is provided in each string to drop the total source voltage across the LEDs. During the positive half of the AC cycle one string of LEDs is forward biased and energized, while the other string is reverse biased. During the negative half of the AC cycle, the other string of LEDs is forward biased and energized, while the first string is reverse biased and not energized. Thus the strings are alternately energized at the frequency of the AC supply (50-60 Hz) and the single-chip LED appears to be constantly energized. The single-chip LED is formed by epitaxially depositing layers of n-type semiconductor material, optically active layers and p-type semiconductor material in succession to define individual LEDs on a single wafer. Adjacent LEDs are interconnected by depositing conducting layers between individual LEDs. Typically individual LEDs are spaced on the LED wafer at a 20 µm separation. Although such a fabrication is compact it has a disadvantage that since only one LED string is energized at a time the arrangement has only a 50% payload.

US 2007/0273299 teaches an AC LED package in which pairs of LEDs or series-connected strings of LEDs are connected in an opposing parallel configuration with at least one capacitor connected in series with each parallel configuration and the AC power supply. The LEDs and capacitor(s) can be fabricated as a single chip, a single package, an assembly or a module. The capacitor regulates the amount of current and forward voltage delivered to the one or more opposing parallel LEDs based on the voltage and frequency provided by the AC driver. Since only LED strings with the same polarity are energized at any one time the arrangement has only a 50% payload.

Presently AC LEDs can be fabricated as a single-chip device as for example is taught in US 2004/0080941, from a plurality of interconnected discrete packaged LEDs or from a plurality of interconnected individual surface mounted devices (SMDs). In the case of a single-chip device the LEDs are monolithically fabricated on a single wafer and LEDs connected in series by photo lithographic deposition of conductors between LEDs. Whilst such an arrangement can achieve a very high packing density of LEDs per unit area of wafer (of the order of 100 to 400 per square cm ($cm^2$) depending on the size of the LED chip) it has a fundamental drawback in that during fabrication a failure of a single LED means that the entire device has to be discarded resulting in a high production cost. In contrast AC LEDs constructed by interconnecting discrete packaged devices, in particular white LEDs that include a phosphor material for wavelength conversion, results in a very low packing density of the order of 5 per $cm^2$. It is also known to fabricate AC LEDs by mounting, typically by soldering, individual SMD LEDs onto a metal core printed circuit board (MCPCB) and such an arrangement can achieve packing densities of the order of 10 LEDs per $cm^2$. However, such an arrangement is generally not suited to white LEDs which additionally require a layer of wavelength converting phosphor over the light emitting face of each LED.

The present invention arose in an endeavor to provide an AC light emitting device which at least in part overcomes the limitations of the known arrangements.

SUMMARY OF THE INVENTION

Embodiments of the invention are directed to a light emitting device comprising a plurality of LEDs that are mounted within recesses of an insulating substrate.

According to the invention a light emitting device comprises: a plurality of light emitting diodes and an insulating substrate having an array of recesses each for housing a respective one of the light emitting diodes, said substrate incorporating a pattern of electrical conductors that is configured for connecting the light emitting diodes in a selected electrical configuration and to provide at least two electrical connections on the floor of each recess and wherein each light emitting diode is connected to the at least two electrical connections. Typically, the packing density of light emitting diodes per unit area of substrate is in a range 30 to 100 per $cm^2$. In one arrangement light emitting diodes are electrically connected to the electrical connections by at least one bond wire. Alternatively, where the light emitting diodes have one or more electrical connections on their base, the light emitting diodes can be electrically connected to the electrical connection by flip chip bonding.

The device can further comprise a thermally conducting pad on the base of each recess for mounting a respective light emitting diode in thermal communication therewith. Preferably, the substrate further comprises a plurality of thermal vias for conducting heat from the thermally conducting pad to an exterior of the substrate. In one implementation the vias can comprise a series of holes passing though the insulating substrate to a rear face of the substrate. The inner wall of each hole is preferably coated with a thermally conducting material such as a metal by for example plating or filing the hole with solder.

To provide environmental protection to the light emitting diodes each recess can be substantially filled with a substantially transparent material, for example a polymer such as a UV or thermally curable silicone or epoxy, to encapsulate each light emitting diode. Advantageously, at least one phosphor material is incorporated in the transparent material, said phosphor material being operable to absorb at least a part of the light emitted by its associated light emitting diode and to re-emit light of a different wavelength.

The light emitting diodes can be series-connected; connected as pairs of light emitting diodes that are then connected in parallel with opposing polarity; connected as half-wave rectifier in which groups of light emitting diodes are connected in series and said groups are connected in parallel with opposing polarity; or connected in a self-rectifying bridge configuration.

As well as implementations in which the light emitting diodes are configured in a self-rectifying arrangement, the light emitting device can further comprise a rectifier arrangement for enabling the device to be operated directly from an AC supply. In one implementation, components of the rectifier arrangement are housed in one or more recesses of the substrate. Preferably, the rectifier arrangement comprises four diodes connected in a bridge rectifier configuration and the pattern of electrical conductors is configured such that the plurality of light emitting diodes are connected in series between the rectifying nodes of the bridge. An advantage of using separate diodes for rectification is that the light emitting diodes operate and emit light for substantially the whole of an AC cycle. The rectifying diodes can comprise silicon, germanium, silicon carbide or gallium nitride devices.

Preferably, the insulating substrate is a low temperature co-fired ceramic (LTCC) though in other implementations it can comprise silicon or a high-temperature polymer. Advantageously, the pattern of electrical conductors comprises a silver alloy.

The light emitting device of the invention device finds particular application in general lighting and each light emitting diode preferably comprises a gallium nitride-based light emitting diode chip that emits light in the blue or UV regions of the electromagnetic spectrum.

To maximize the number of light emitting diodes that can be housed on a given area of substrate, the array of recesses is preferably configured as a square array. In one implementation that is configured for 110V operation the array of recesses comprises a square array of forty nine apertures of which forty five are configured to house a respective light emitting diode and the remaining four can each house a rectifier diode.

According to a further aspect of the invention an AC light source comprises an elongate circuit board having a plurality of light emitting devices according to the invention mounted on and disposed along the length of the circuit board and an elongate substantially transparent enclosure, said circuit board being configured to fit within said enclosure.

According to a yet further aspect of the invention an AC light source comprises a ring shaped circuit board having a plurality of light emitting devices according to the invention mounted on and configured as a circular array, a body to which the circuit board in mounted in thermal communication therewith and a connector for connecting the light source to an AC supply.

BRIEF DESCRIPTION OF THE DRAWINGS

In order that the present invention is better understood embodiments of the invention will now be described, by way of example only, with reference to the accompanying drawings in which.

DETAILED DESCRIPTION OF THE INVENTION

A white light emitting AC light emitting device 10 in accordance with a first embodiment of the invention will now be described with reference to FIGS. 1 to 5 of the accompanying drawings. The AC light emitting device 10 is configured for direct operation from a 110V (r.m.s.) AC (60 Hz) mains power supply as is found in North America.

Figure 1:
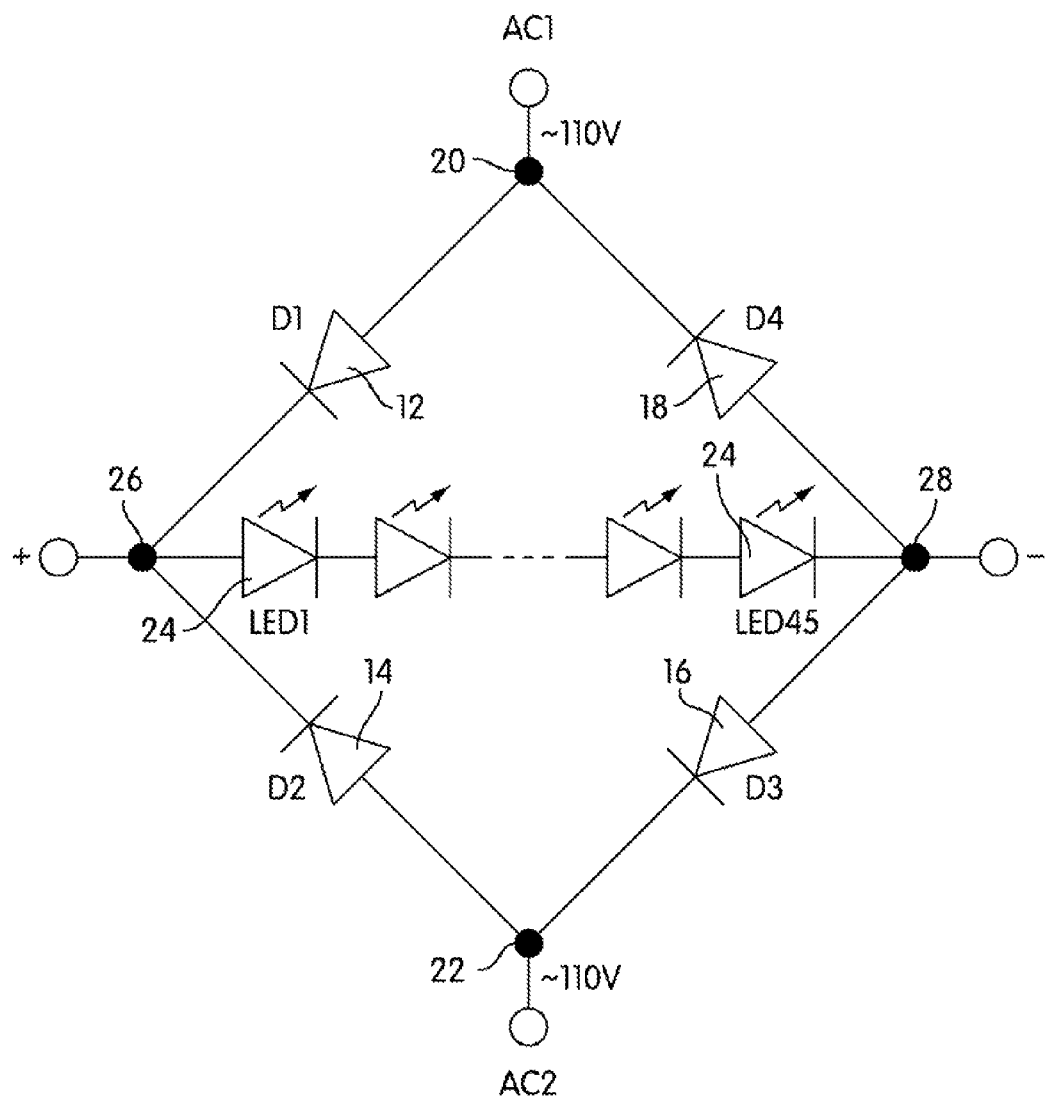
FIG. 1 is a circuit diagram of a light emitting device in accordance with an embodiment of the invention.

FIG. 1 is a circuit diagram of the AC light emitting device 10 of the invention and comprises four rectifier diodes 12, 14, 16, 18 (D1 to D4) connected in series in a closed loop bridge configuration. The rectifier diodes (D1 to D4) can comprise silicon, germanium, silicon carbide, or gallium nitride devices. A mains 110V AC power source is connectable to opposite nodes 20 and 22 (AC1 and AC2) of the bridge and forty five series-connected gallium nitride-based blue or UV emitting LED chips 24 (LED1 to LED45) connected between the rectified positive 26 (+) and negative 28 (−) nodes of the diode bridge. For 110V operation each LED chip 24 drops a peak voltage of 3.426V [AC Peak Voltage−Voltage drop across rectifier diodes÷number of LEDs: (110×1.414−2× 0.68)/45=3.426].

Figure 2:
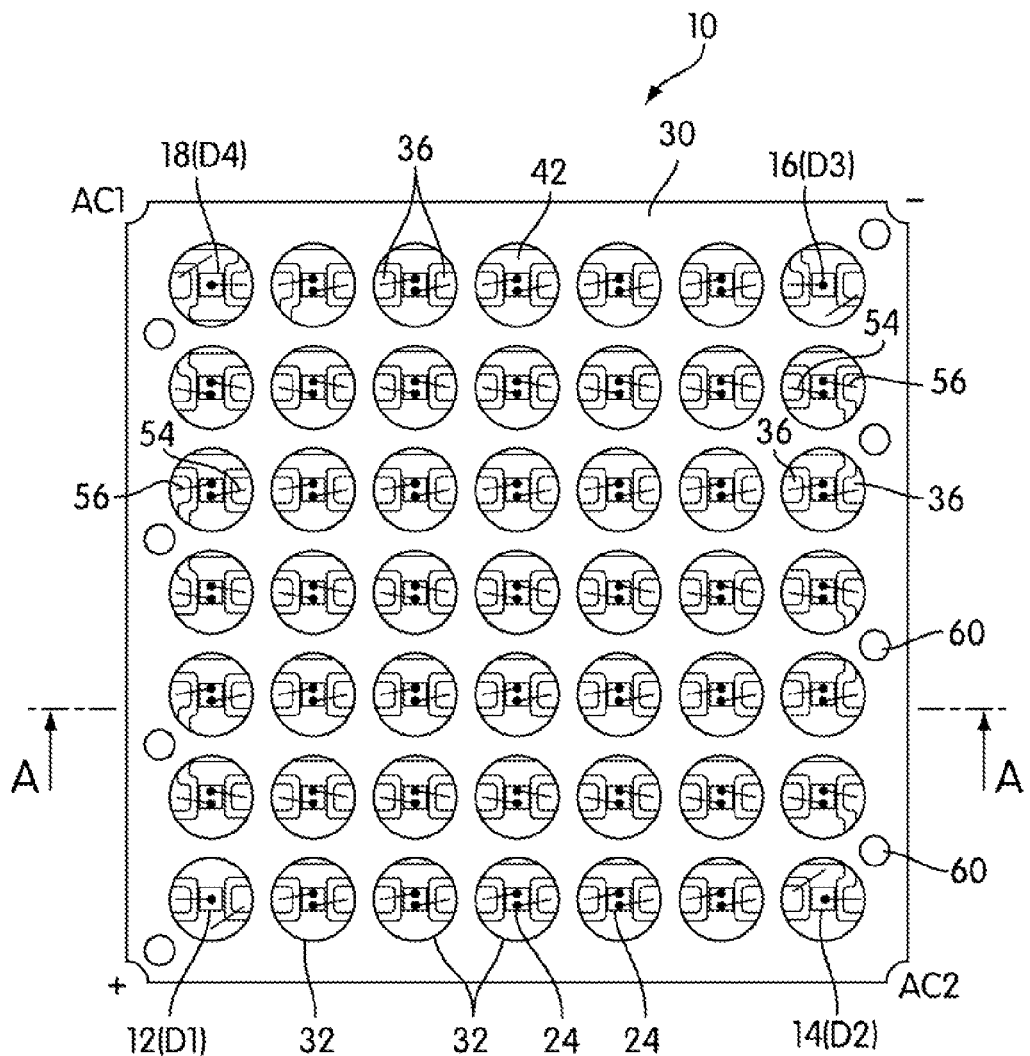
FIG. 2 is a plan view of a light emitting device in accordance with the invention.

Referring to FIG. 2 a preferred implementation of the AC light emitting device 10 comprises a square ceramic substrate (package) 30 having an array of forty nine circular recesses (blind holes or cavities) 32 that are arranged as a regular square array of seven rows by seven columns. As is described below, the circular recesses 32 are configured to house a respective one of the LED chips 24 or one of the rectifier diodes 12 to 18 (D1 to D4). Typically the ceramic package is 12 mm square and each recess 1 mm in diameter with a spacing of 2 mm between the centers of neighboring recesses. Such an arrangement achieves a packing density of up to thirty four LED chips per $cm^2$ of substrate. In comparison in the known arrangements in which individual surface mounted device (SMD) LEDs are soldered on a metal core printed circuit (MCPCB) the highest packing density of SMD LEDs is of the order of 6 per $cm^2$ of substrate. It will be appreciated that the size and spacing of the recesses 32 is configured in dependence on the dimensions of the LED chips and will typically be in a range 0.3 mm to 2 mm. To optimize the packing density per unit area each recess is dimensioned such as to be able to just accommodate the LED chip. A square array of recesses is preferred since this maximizes the number of LEDs chips per unit area of substrate whist still enabling the LED chips to be interconnected.

Figure 3:
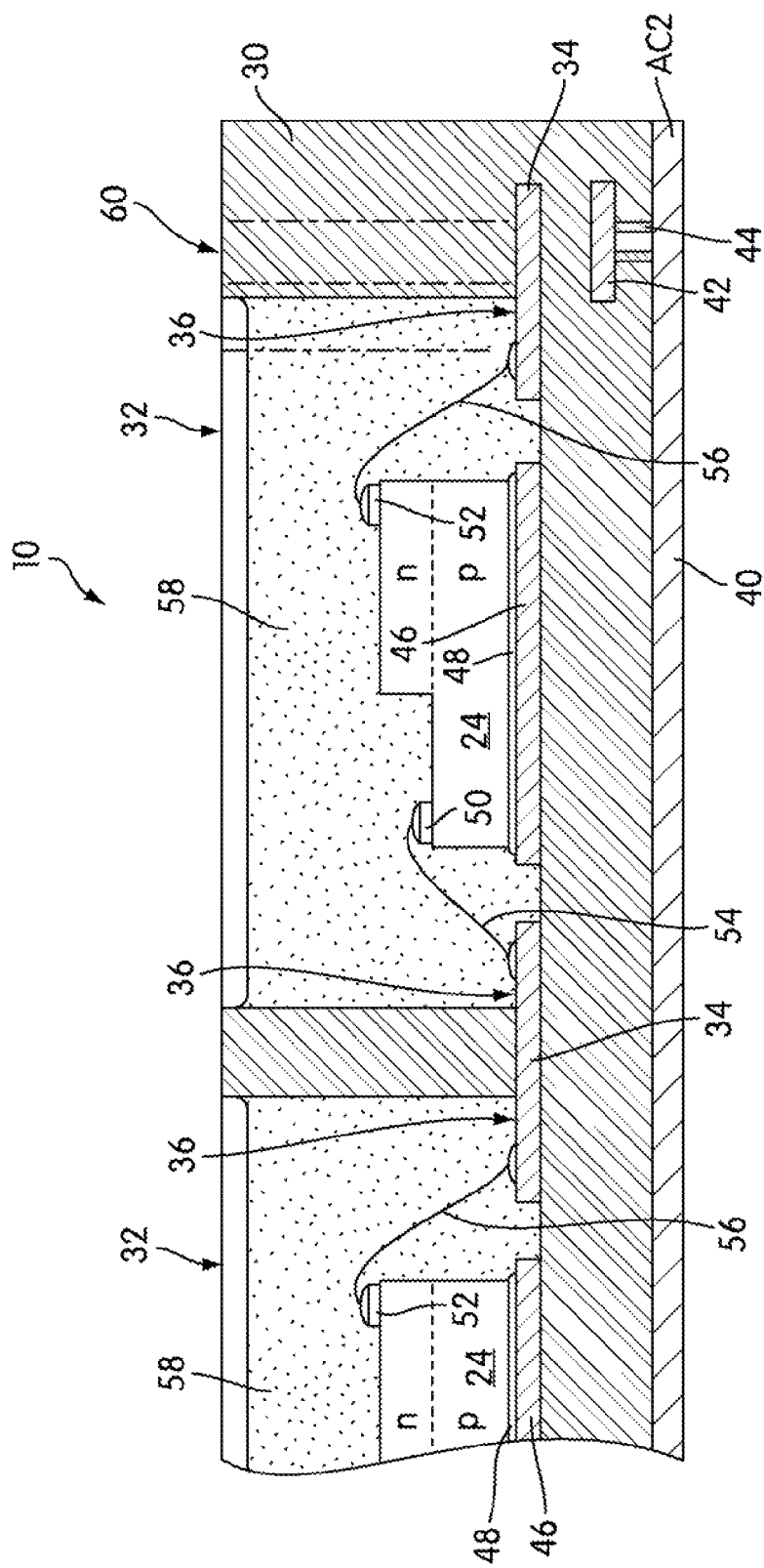
FIG. 3 is a schematic sectional representation of the light emitting device of FIG. 2 through a line "AA"

FIG. 3 is a schematic cross-sectional view through the plane A-A of the device 10 of FIG. 2. The ceramic substrate (package) 30 is a multi-layered structure and preferably comprises a low temperature co-fired ceramic (LTCC) which incorporates a pattern of electrically conducting tracks 34, which can for example comprise a silver alloy, that are configured to interconnect the LED chips 24 and rectifier diodes (D1 to D4) in the bridge configuration shown in FIG. 1. The conducting tracks 34 are configured such that a part of them extends into the recess to provide a pair of electrode pads 36 on the floor of the recess for electrical connection to a respective LED chip or rectifier diode. It will be appreciated that the electrode pads 36 are accessible through the recess 32 opening. On a lower face of the package one or more solder pads 40 are provided for electrically connecting the device 10 to an AC power source and to enable electrical access to the rectified supply between the rectified nodes 26, 28. The substrate 30 can further include one or more buried electrode tracks 42 that are interconnected to the solder pad and/or electrically conducting tracks 34 by conducting vias 44. On the floor of each recess 32 a thermally conducting mounting pad 46, such as for example a pads of silver alloy, is provided onto which an LED chip 24 or rectifier diode (D1 to D4) can be mounted.

Figure 4:
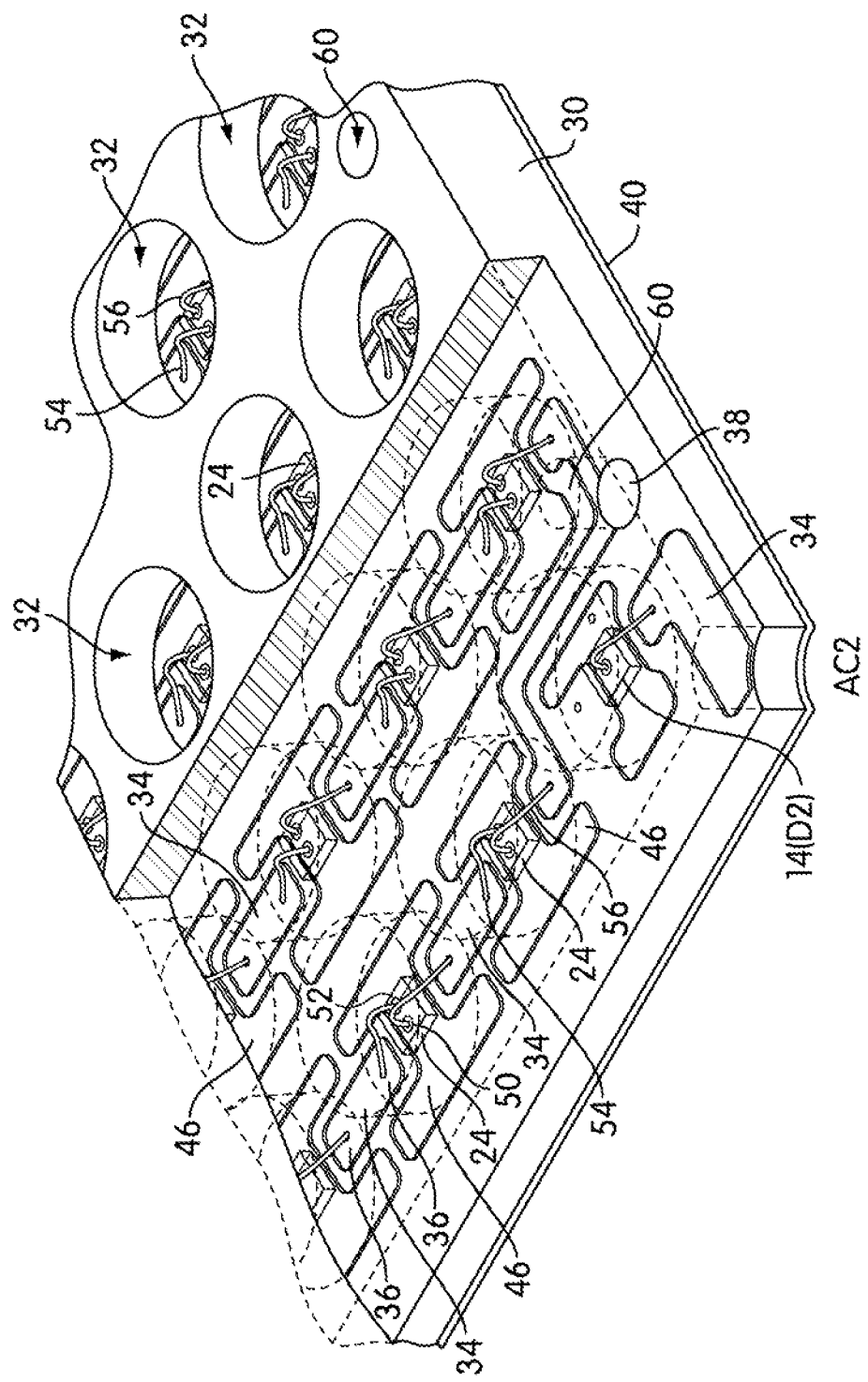
FIG. 4 is a perspective part sectional representation of the light emitting device of FIG. 2.

FIG. 4 is a perspective part sectional view of the AC light emitting device 10 in which the upper part of the ceramic substrate 30 containing the recesses 32 has been removed to make the configuration of the electrically conducting tracks 34 and electrode pads 36 visible. As can be seen from the figure the thermally conducting mounting pads 46 are generally "H" shaped in form to maximize their surface area. The LED or diode is mounted in thermal communication with the mounting pad 46 using a thermally conducting adhesive such as a silver loaded epoxy 48 or by soldering using a low temperature solder such as a gold/tin solder. Respective electrodes 50, 52 on an upper (light emitting) surface of the LED chip/diode are connected by bond wires 54, 56 to a respective electrode pads 36 on the floor of the recess 32. The LED chip 24 can comprise red, green, blue, amber or white light emitting LED chips. In the exemplary embodiment each LED chip comprises a blue or UV light emitting gallium nitride-based LED chip. Since it is required to generate white light each recess is potted with a phosphor (photo luminescent material) material 58. For clarity the phosphor material 58 is not included in FIGS. 2 and 4. The phosphor material, which is typically in powder form, is mixed with a transparent binder material such as a polymer material (for example a thermally or UV curable silicone or an epoxy material) and the polymer/phosphor mixture applied to the light emitting face of each LED chip. The AC LED of the invention is particularly suited to use with inorganic phosphor materials such as for example silicate-based phosphor of a general composition $A_3Si(OD)_5$ or $A_2Si(OD)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in our co-pending patent applications US2006/0145123, US2006/028122, US2006/261309 and US2007/029526 the content of each of which is hereby incorporated by way of reference thereto.

As taught in US2006/0145123, a europium ($Eu^{2+}$) activated silicate-based green phosphor has the general formula $(Sr,A_1)_x(Si,A_2)(O,A_3)_{2+x}:Eu^{2+}$ in which: $A_1$ is at least one of a 2+ cation, a combination of 1+ and 3+ cations such as for example Mg, Ca, Ba, zinc (Zn), sodium (Na), lithium (Li), bismuth (Bi), yttrium (Y) or cerium (Ce); $A_2$ is a 3+, 4+ or 5+ cation such as for example boron (B), aluminum (Al), gallium (Ga), carbon (C), germanium (Ge), N or phosphorus (P); and $A_3$ is a 1−, 2− or 3− anion such as for example F, Cl, bromine (Br), N or S. The formula is written to indicate that the $A_1$ cation replaces Sr; the $A_2$ cation replaces Si and the $A_3$ anion replaces O. The value of x is an integer or non-integer between 2.5 and 3.5.

US2006/028122 discloses a silicate-based yellow-green phosphor having a formula $A_2SiO_4:Eu^{2+}$ D, where A is at least one of a divalent metal comprising Sr, Ca, Ba, Mg, Zn or cadmium (Cd); and D is a dopant comprising F, Cl, Br, iodine (I), P, S and N. The dopant D can be present in the phosphor in an amount ranging from about 0.01 to 20 mole percent. The phosphor can comprise $(Sr_{1-x-y}Ba_xM_y)SiO_4:Eu^{2+}F$ in which M comprises Ca, Mg, Zn or Cd.

US2006/261309 teaches a two phase silicate-based phosphor having a first phase with a crystal structure substantially the same as that of $(M1)_2SiO_4$; and a second phase with a crystal structure substantially the same as that of $(M2)_3SiO_5$ in which M1 and M2 each comprise Sr, Ba, Mg, Ca or Zn. At least one phase is activated with divalent europium ($Eu^{2+}$) and at least one of the phases contains a dopant D comprising F, Cl, Br, S or N. It is believed that at least some of the dopant atoms are located on oxygen atom lattice sites of the host silicate crystal.

US2007/029526 discloses a silicate-based orange phosphor having the formula $(Sr_{1-x}M_x)_yEu_zSiO_5$ in which M is at least one of a divalent metal comprising Ba, Mg, Ca or Zn; $0<x<0.5$; $2.6<y<3.3$; and $0.001<z<0.5$. The phosphor is configured to emit visible light having a peak emission wavelength greater than about 565 nm.

The phosphor can also comprise an aluminate-based material such as is taught in our co-pending patent applications US2006/0158090 and US2006/0027786 the content of each of which is hereby incorporated by way of reference thereto.

US2006/0158090 teaches an aluminate-based green phosphor of formula $M_{1-x}Eu_xAl_yO_{[2+3y/2]}$ in which M is at least one of a divalent metal comprising Ba, Sr, Ca, Mg, Mn, Zn, Cu, Cd, Sm and thulium (Tm) and in which $0.1<x<0.9$ and $0.5 \leq y \leq 12$.

US2006/0027786 discloses an aluminate-based phosphor having the formula $(M_{1-x}Eu_x)_{2-z}Mg_zAl_yO_{[2+3y/2]}$ in which M is at least one of a divalent metal of Ba or Sr. In one composition the phosphor is configured to absorb radiation in a wavelength ranging from about 280 nm to 420 nm, and to emit visible light having a wavelength ranging from about 420 nm to 560 nm and $0.05<x<0.5$ or $0.2<x<0.5$; $3 \leq y \leq 12$ and $0.8 \leq z \leq 1.2$. The phosphor can be further doped with a halogen dopant H such as Cl, Br or I and be of general composition $(M_{1-x}Eu_x)_{2-z}Mg_zAl_yO_{[2+3y/2]}$:H.

Alternatively the phosphor can comprise a nitridosilicate-based phosphor compound that emits in the red region of the visible spectrum and is of general formula $M_aM_bB_c(N,D):Z$ where $M_a$ is a divalent alkaline earth element such as Mg, Ca, Sr or Ba; $M_b$ is a trivalent metal such as Al, Ga, Bi, Y, La or Sm; $M_c$ is a tetravalent element such as Si, Ge, P or B, N is nitrogen, D is a halogen such as F, Cl or Br; and Z is an activator such as Europium $Eu^{2+}$.

It will be appreciated that the phosphor is not limited to the examples described herein and can comprise any inorganic phosphor material including for example nitride and sulfate phosphor materials, oxy-nitrides and oxy-sulfate phosphors or garnet materials (YAG).

The ceramic substrate 30 can further include a plurality of testing holes 60 that are arranged along opposite edges of the package 30. The holes 60 enable the underlying electrode pads 38 that correspond to the nodes interconnecting strings of LED chips 24 to be electrically probed.

Figure 5:
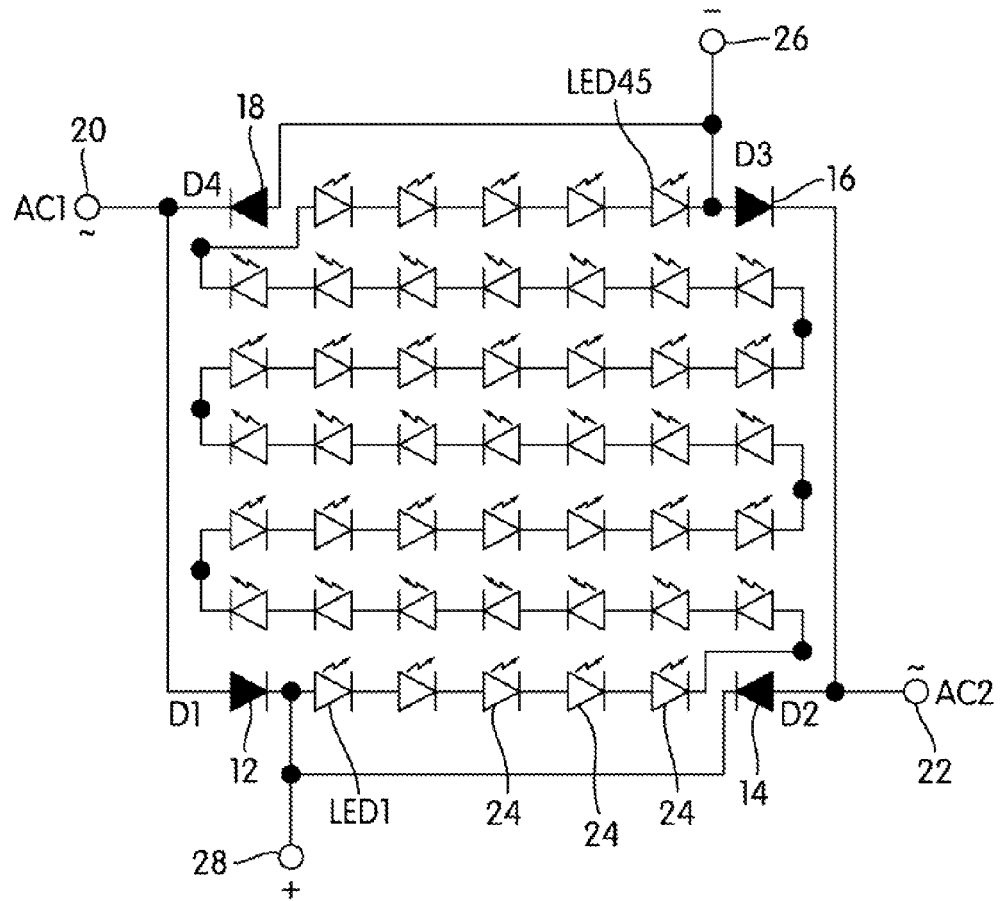
FIG. 5 is a circuit diagram of the light emitting device indicating the relationship between the LEDs and their physical location within the light emitting device.

FIG. 5 is a circuit diagram of the AC LED in accordance with the invention indicating the correspondence between the LED chips and the physical location of their associated recess 32.

Figure 6:
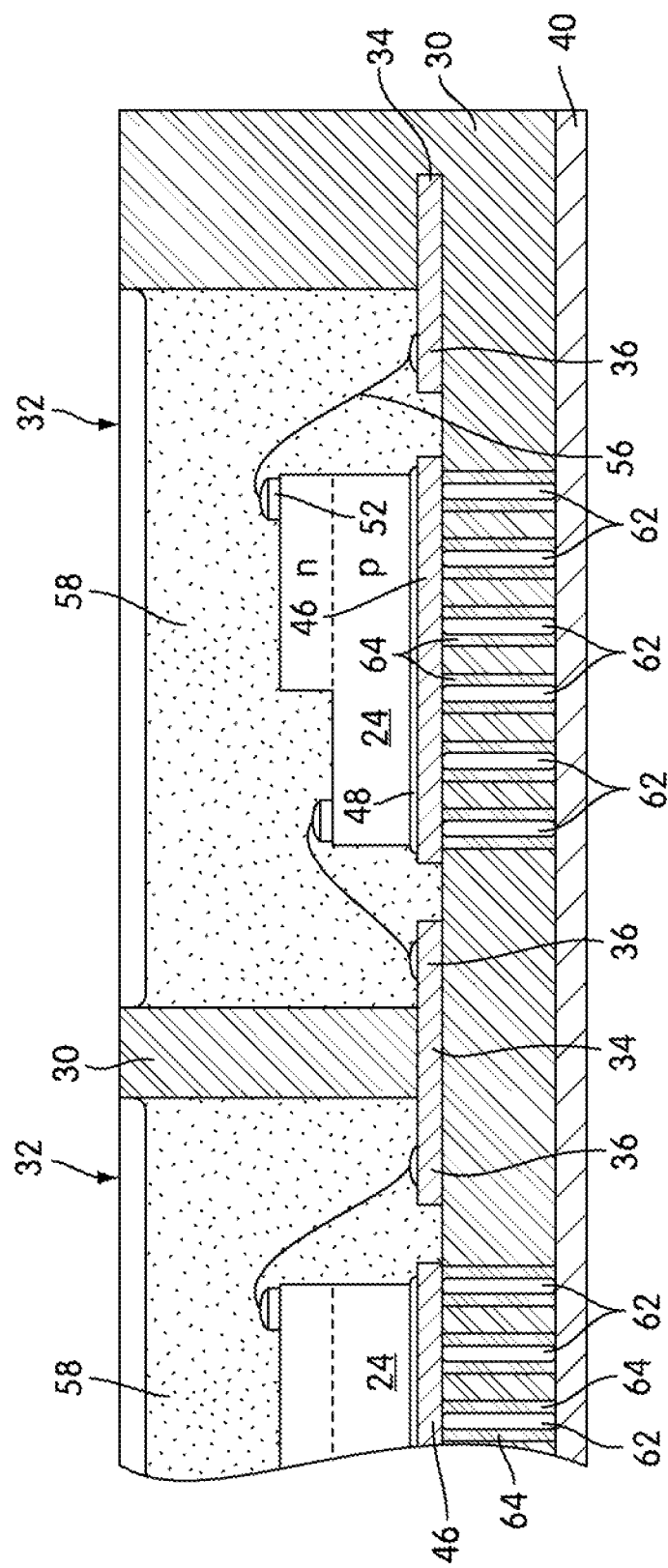
FIG. 6 is a schematic part sectional representation of the light emitting device of FIG. 2 showing thermal vias.

To improve conduction of heat out of the device 10 the ceramic substrate 30 can further incorporate thermal vias 62 that provide a conduction path for heat from the thermal mounting pads 46 to an exterior surface of the device such as for example the solder pad 40 on the rear (base) of the device (FIG. 6). As illustrated, the thermal vias 62 can comprise an array of holes that pass through the floor of each recess 32 corresponding to the thermal mounting pad 46 to the base of the device. The wall of each hole is coated with a thermally conducting material 64 such as a metal by for example plating or filling the holes with a solder 64.

Figure 7:
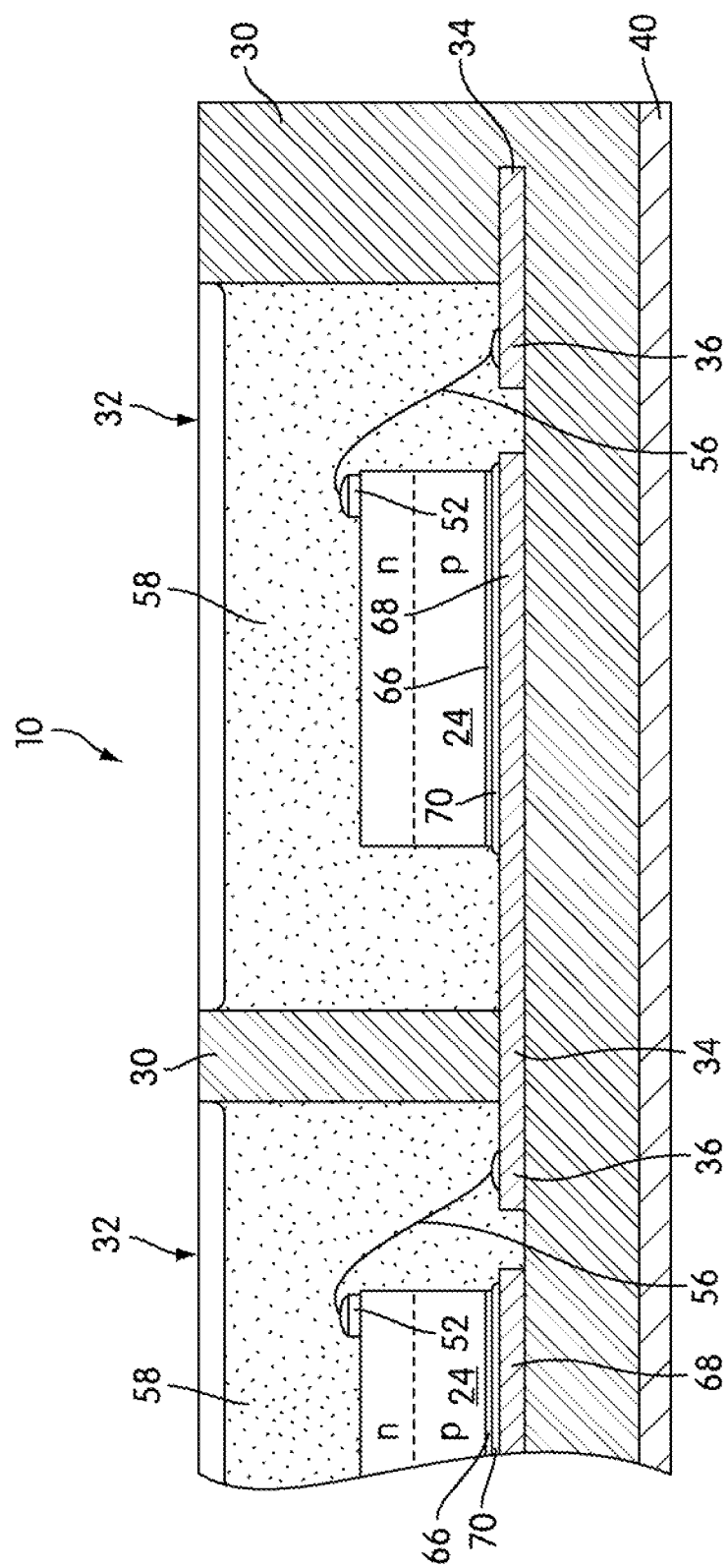
FIG. 7 is a schematic sectional representation of a light emitting device in accordance with a further embodiment of the invention.

FIG. 7 is a schematic sectional representation of an AC light emitting device 10 in accordance with a further embodiment of the invention in which the LED chips 24 have one electrode 52 on their upper light emitting surface and a conducting plane 66 on their lower surface. For such LED chips 24 one electrode 68 on the floor of each recess is extended into the recess and provides a combined thermal mounting and electrode pad. The conducting plane 66 of the LED is electrically connected to the mounting/electrode pad 68 by for example soldering using a low temperature gold/tin solder 70 and the electrode 52 connected to the electrode pad 36 by a bond wire 56.

Figure 8:
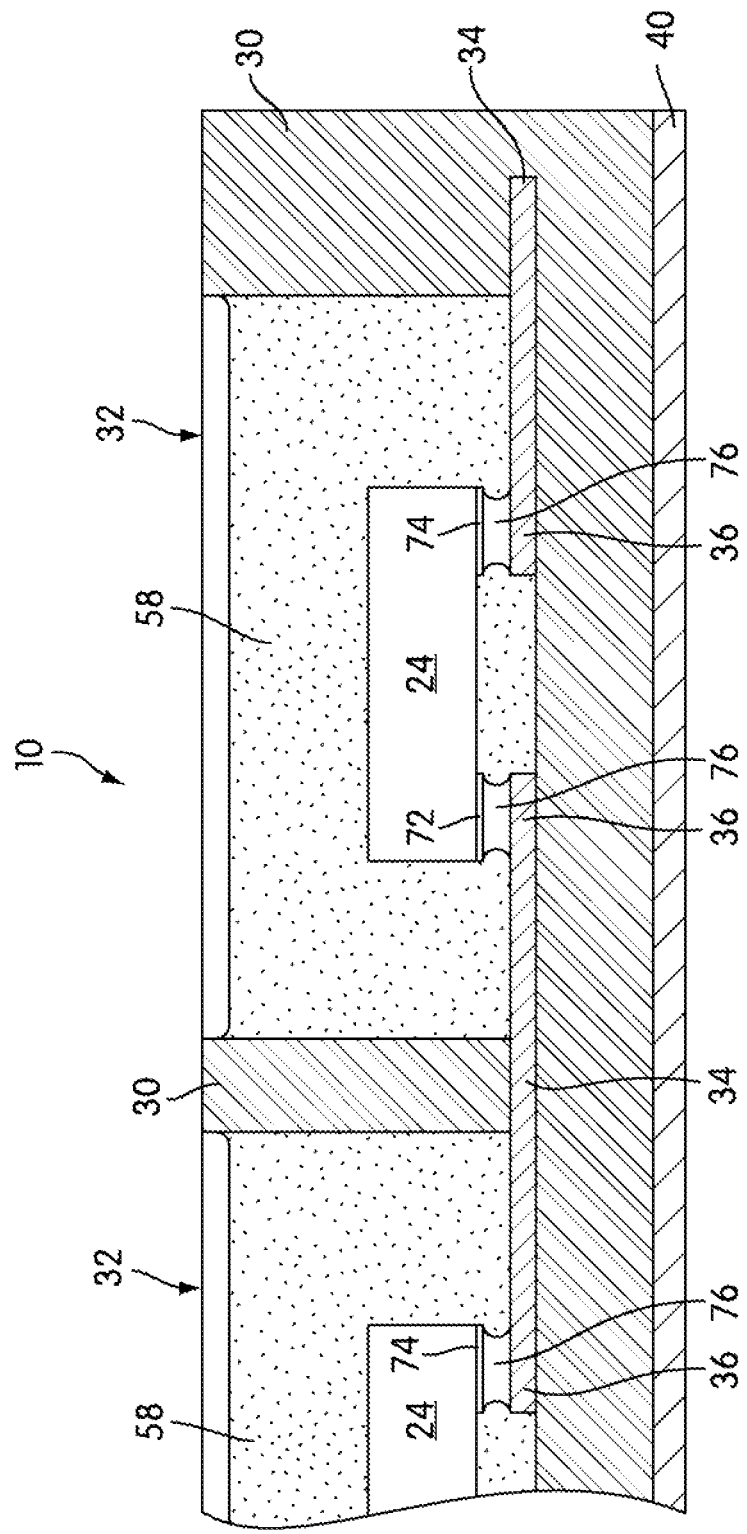
FIG. 8 is a schematic sectional representation of a light emitting device in accordance with a yet further embodiment of the invention.

FIG. 8 is a schematic sectional representation of an AC light emitting device in accordance with yet a further embodiment of the invention in which the LED chips 24 have a pair of electrodes 72, 74 on their base. Each LED chip is electrically connected to the electrode pads 36 by flip chip bonding 76 each electrode 72, 74 to a respective one of the electrode pads 36. For such an arrangement the recesses 32 can be 0.5 mm in diameter for receiving a 300 μm square chip with the centers spaced at a 0.5 mm separation enabling a packing density of 100 LED chips per square cm.

Figure 9:
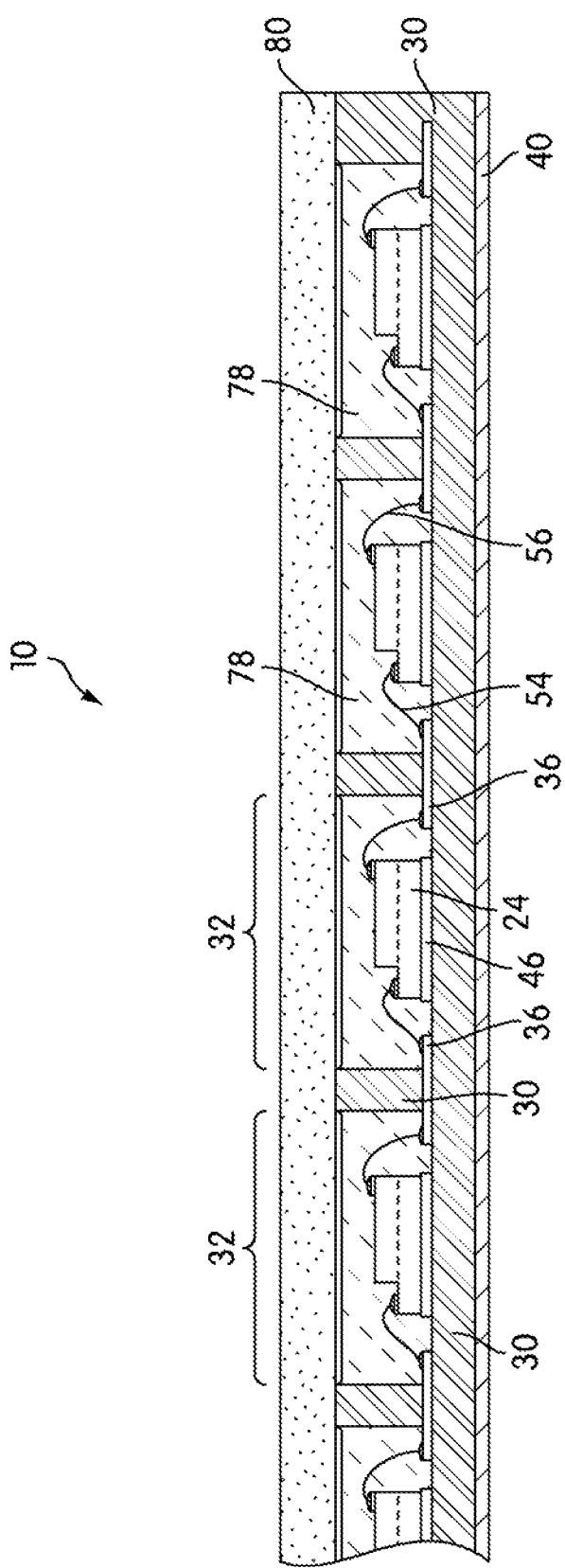
FIG. 9 is a schematic sectional representation of a light emitting device in accordance with a yet further alternative embodiment of the invention.

FIG. 9 is schematic sectional representation of a preferred implementation of an AC light emitting device in accordance with the invention. In this embodiment each recess 32 is filled with a transparent material 78 such as to cover and encapsulate each LED chip 24. Examples of suitable transparent materials are UV or thermally curable silicone materials such as GE's silicone RTV615 or an epoxy material. The transparent material 78 constitutes a passivation coating of the LED chip 24 and bond wires 54, 56 and provides environmental protection of the LED chip and bond wires. Generally it is preferred to completely fill each recess 32 with the transparent material 78. In the embodiment of FIG. 9 a separate layer of phosphor containing material 80 is provided overlying each of the recesses 32. Preferably, the layer of phosphor containing material 80 is fabricated as a separate sheet which is then cut into appropriately sized pieces that can then be bonded onto the face on the substrate 30 with for example a transparent adhesive. The phosphor material(s), which is/are in powder form, is/are mixed in pre-selected proportions with a transparent polymer material such as for example a polycarbonate material, an epoxy material or a thermosetting or UV curable transparent silicone. An example of a suitable silicone material is GE's silicone RTV615. The weight ratio loading of phosphor mixture to silicone is typically in a range 35 to 65 parts per 100 and the exact loading will depend on the target correlated color temperature (CCT) of the device. The phosphor/polymer mixture is then extruded to form a homogeneous phosphor/polymer sheet with a uniform distribution of phosphor throughout its volume. Typically phosphor/polymer sheet has a thickness of the order of 100 μm. As is the case of the weight loading of the phosphor to polymer, the thickness of the phosphor layer 80 (phosphor/polymer sheet) will depend on the target CCT of the finished device. The configuration of FIG. 9 offers a number of advantages compared with the device in which individual recess are potted with a phosphor containing material these being namely:

a reduction in manufacturing costs since only a single light emitting device need be fabricated and the CCT and/or color hue of light generated by the device selected by applying an appropriate sheet of phosphor containing material;

a more consistent CCT and/or color hue is achievable; and since the phosphor is located remote to the LED chip this reduces thermal degradation of the phosphor.

Moreover, it will be appreciated that as well as providing environmental protection of the device the transparent material 78 additional acts as a thermal barrier further reducing the conduction of heat to the phosphor.

Figure 10:
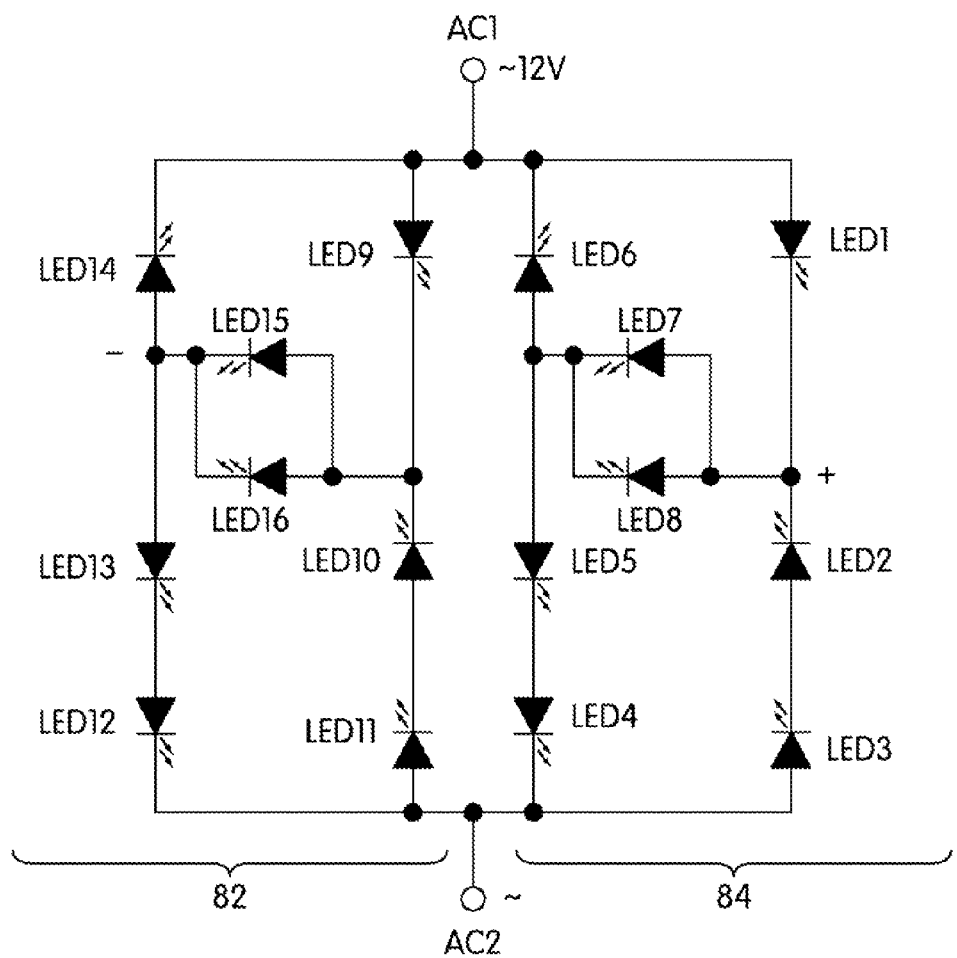
FIG. 10 is a circuit diagram of a light emitting device in accordance with a further embodiment of the invention.

FIG. 10 is a circuit diagram of a light emitting device for direct operation from a 12V AC supply that comprises sixteen LED chips (LED1 to LED16). As illustrated in FIG. 10 the LED chips are connected as a self-rectifying arrangement that comprises two full-wave bridge rectifier circuits 82, 84 connected in parallel between terminals AC1 and AC2 of the AC supply. The first bridge rectifier 82 comprises in respective arms of the bridge: LED1 in the first arm; series-connected LED2 and LED3 in the second arm; series-connected LED4 and LED5 in the third arm; and LED6 in the fourth arm. The remaining two LED chips, LED7 and LED8, are connected in parallel between the rectifying nodes (+,−) of the first bridge. Similarly, the second bridge rectifier 84 comprises in respective arms of the bridge: LED9; series-connected LED10 and LED11; series-connected LED12 and LED13; and LED14. The remaining two LED chips, LED15 and LED16, are connected in parallel between the rectifying nodes (+,−) of the second bridge. As in other embodiments of the invention the LED chips are housed in a respective recess 32 of a ceramic substrate (package) 30. Conveniently the substrate is square in shape and has a square array of recesses 4 rows by 4 columns. Whilst a self-rectifying arrangement eliminates the need for additional rectifier diodes it will reduce the payload of the circuit since only the LEDs (i.e. LED7, LED8 and LED15, LED16) between the rectifying nodes (+,−) of the bridges are energized for a complete AC cycle. In contrast LED1, LED4, LED5 and LED9, LED12, LED13 will be energized on positive half cycles and LED2, LED3, LED6 and LED10, LED11, LED15 will be energized on negative half cycles and will each be respectively energized for 50% of the time.

Figure 11:
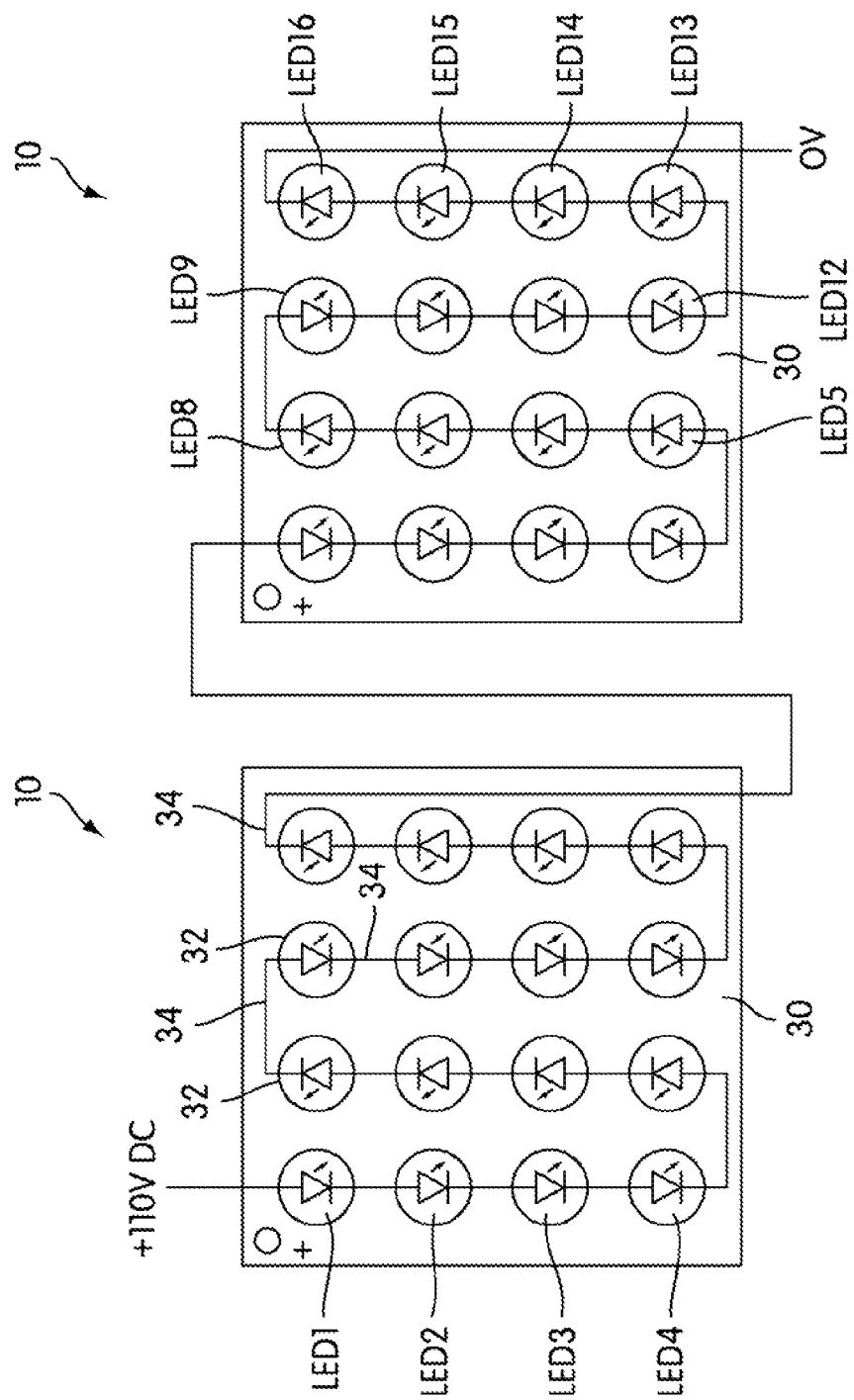
FIG. 11 is a schematic representation of a light emitting device in accordance with a yet further embodiment of the invention.

Although the present invention arose in an endeavor to provide an AC light emitting device capable of operation from a high voltage AC source it will be appreciated that the invention also finds applications for operation from direct current (DC) sources. FIG. 11 is a schematic representation of a white light emitting device for operation from a 110V DC supply that comprises two series-connected devices 10 in which each device has sixteen series-connected LED chips (LED1 to LED16). As illustrated in FIG. 11 each device 10 comprises a square ceramic substrate 30 having sixteen recesses 32 that are arranged as a square array of 4 rows by 4 columns. Each recess 32 houses a respective one of the LED chips (LED1 to LED16). As described above the ceramic substrate further includes electrically conducting tracks 34 that are configured to connect the LED chips in a series arrangement. A benefit of such a device 10 is its modular nature in that the same device can be operated from 110V DC or 220V DC by respectively connecting two or four such devices in series.

Figure 12:
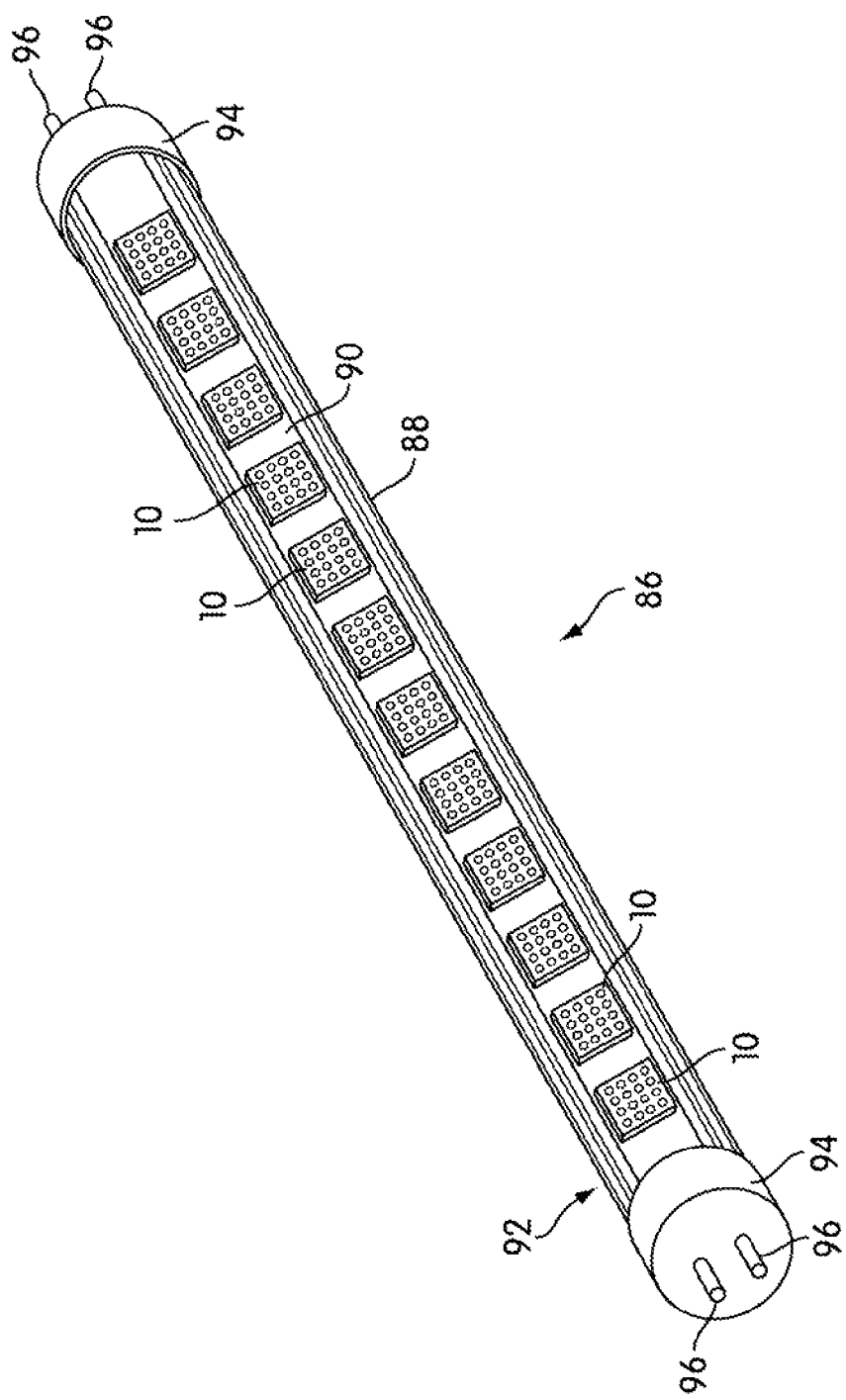
FIG. 12 is a schematic perspective representation of a tubular lamp incorporating light emitting devices of the invention.

The light emitting device of the invention finds particular application in general lighting applications and FIG. 12 is a schematic perspective representation of a tubular lamp 86 based on light emitting devices 10 of the invention. The lamp 86 is intended as a replacement for a conventional incandescent tubular bulb or a fluorescent tube and is configured for mains operation 110V AC. In this exemplary embodiment the lamp 86 is elongate in form and comprises a transparent or translucent substantially tubular (cylindrical) enclosure 88. The tubular enclosure 86 can be made from a transparent plastics material such as a polycarbonate material or from a glass material. A plurality of light emitting devices 10, such as for example the devices of FIG. 11, are mounted at an equal spacing along the length of a metal core printed circuit board (MCPCB) 90. The MCPCB 90 is elongate in form and is configured to fit inside the tubular enclosure 90. The rear face of the MCPB 90 is mounted in thermal communication a heat sink 92 which runs substantially the length of the lamp. The heat sink can additionally be in thermal communication with a respective end cap 94 to enable heat to be dissipated to a larger thermal mass such as the lighting fixture into which the lamp is mounted. Rectifier circuitry (not shown) can be housed within the end caps 94 to enable the lamp to be operated directly from a mains supply via connecting pins 96 on the end caps.

Figure 13:
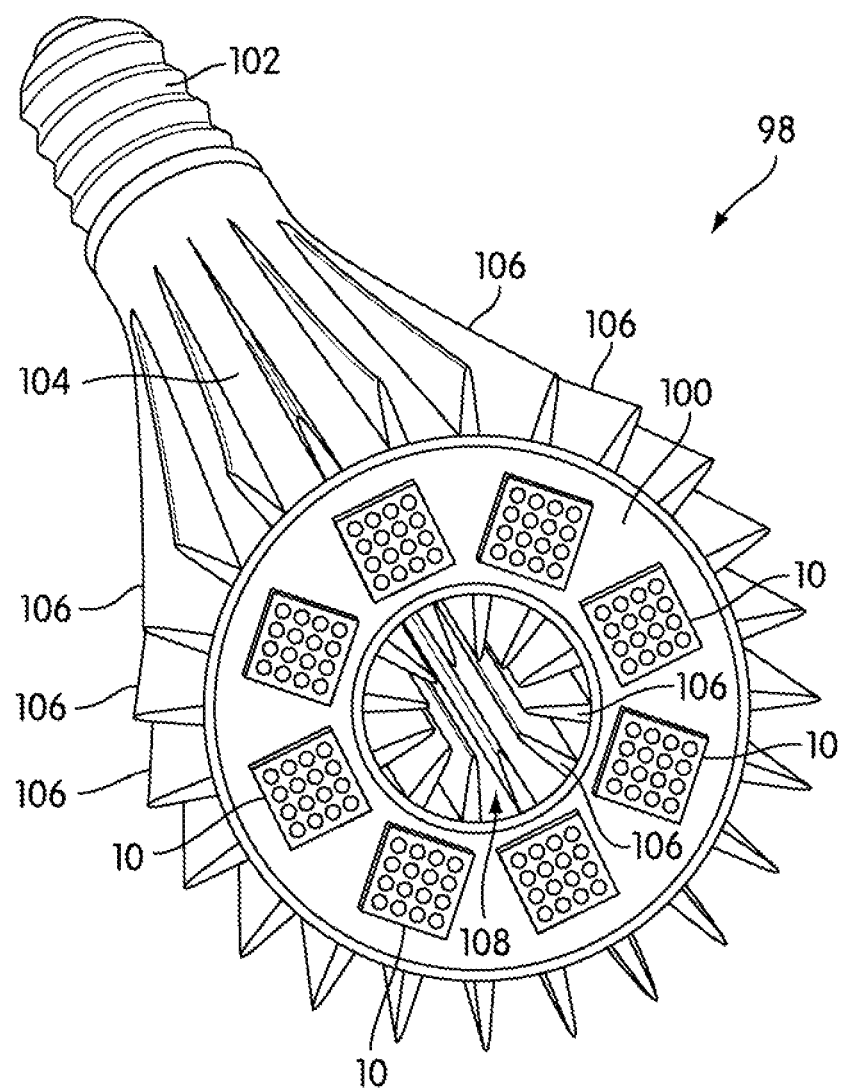
FIG. 13 is a schematic perspective representation of a white light source incorporating light emitting devices of the invention.

FIG. 13 a perspective representation of a light bulb 98 in accordance with the invention which is intended as a direct replacement for a conventional incandescent light bulb. In this embodiment plurality of light emitting devices 10 are mounted in a circular array on a ring shaped MCPCB 100. The bulb 98 is intended for mains operation 110V AC and comprises an E26 standard base (screw connector) 102 for direct connect to a mains power supply. It will be appreciated that other connectors can be used such as, for example, a bayonet connector as is commonly used in the United Kingdom. The main body 104 of the bulb comprises a generally coned shaped heat sink 104 having a plurality of heat radiating fins 106 extending axially along the outer surface and axially within a central bore 108. The ring shaped MCPCB 100 is mounted in thermal communication with the circular base of the heat sink 104. Rectifier circuitry (not shown) can be housed within the screw connector 102 to enable the light emitting devices 10 to be operated directly from a mains power supply. The bulb can additionally comprise a transpare or translucent front cover (not shown).

It will be appreciated that in the various exemplary embodiments the LEDs 24 are housed in a respective recess 32 having a pair of electrode pads (electrical conductors) 36 on the floor of the recess for connection to the electrodes of the LED. Particular advantages of the light emitting device of the invention are (a) it is possible to readily fabricate devices with a relatively high packing density of LEDs, typically 30 to 100 LEDs per $cm^2$ and (b) since each LED is housed in a respective recess a phosphor encapsulation can be readily provided by potting each recess with one or more phosphor materials to achieve a desired correlated color temperature and or color hue of emitted light.

It will be appreciated that the present invention is not restricted to the specific embodiments described and that variations can be made that are within the scope of the invention. For example, by appropriate selection of the number of LED chips the AC light emitting device of the invention can be directly operated from other high voltage mains power supply such as for example 220V AC (50 Hz) as used in Europe and Asia. Moreover, each device can be configured for operation at lower voltages such as for example 12V AC and a string of series-connected devices operated from a higher voltage AC supply.

Moreover, whilst a ceramic substrate (package) is preferred for operation with high AC voltage supplies the package can in alternative embodiments comprise other electrically insulating materials such as silicon having a good thermal conductivity or a high-temperature polymer material.

What is claimed is:

1. A light emitting device comprising:
  a plurality of light emitting diodes on an insulating substrate having an array of recesses and walls;
    a phosphor containing layer overlying the insulating substrate to cover the recesses and walls of the insulating substrate without contacting the plurality of light emitting diodes, said phosphor containing layer being substantially uniform and having at least one phosphor material being operable to absorb at least a part of the light emitted by the light emitting diodes and to re-emit light of a different wavelength;
    wherein each recess houses one of the light emitting diodes so that the one of the light emitting diodes is fully received within the recess and not protruding from a surface of the insulating substrate;
    wherein the light emitting diode housed in each recess emits light from within the recess;
    wherein the substrate incorporates a pattern of electrical conductors configured for connecting the light emitting diodes in a. selected electrical configuration and to provide at least two electrical connections on the floor of each recess;
    wherein each light, emitting diode is connected to the at least two electrical connections;
    wherein the device further comprises a rectifier arrangement for enabling the light emitting diodes to be operated directly from an AC supply;
    wherein components of the rectifier arrangement are housed in one or more recesses;
    wherein the rectifier arrangement comprises four diodes connected in a bridge rectifier configuration and wherein the pattern of electrical conductors is configured such that the light emitting diodes are connected in series between the rectifying nodes of the bridge; and wherein the walls are substantially perpendicular to the plane of the substrate.

2. The device of claim 1, wherein the packing density of light emitting diodes per unit area of substrate is in a range 30 to 100 per cm$^2$.

3. The device of claim 1, wherein light emitting diodes are electrically connected to the electrical connections by at least one bond wire.

4. The device of claim 1, wherein light emitting diodes are electrically connected to the electrical connections by flip chip bonding.

5. The device of claim 1, and further comprising a thermally conducting pad on the base of each recess for mounting a respective light emitting diode in thermal communication therewith.

6. The device of claim 5, wherein the substrate further comprises thermal vias for conducting heat from the thermally conducting pad to an exterior of the substrate.

7. The device of claim 1, and further comprising a substantially transparent material substantially filling each recess to encapsulate each light emitting diode.

8. The device of claim 7, wherein the transparent material is selected from the list consisting of: a UV curable polymer; a thermally curable polymer; an epoxy; and a silicone material.

9. The device of claim 1, wherein the diodes are selected from the group consisting of: silicon; germanium; silicon carbide; and gallium nitride diodes.

10. The device of claim 1, wherein the insulating substrate is selected from the group consisting of: a low temperature co-fired ceramic; silicon; and a high temperature polymer.

11. The device of claim 1, wherein the light emitting diode comprise a gallium nitride-based light emitting diode chip.

12. The device of claim 1, wherein the array of recesses is configured as a square array.

13. An AC light source comprising:
an elongate circuit board having a plurality of light emitting devices according to claim 1 mounted on and disposed along the length of the circuit board: and
an elongate substantially transparent enclosure;
wherein the circuit board is configured to fit within said enclosure.

14. An AC light source comprising:
a ring shaped circuit board having a plurality of light emitting devices according to claim 1, the plurality of light emitting devices being mounted on and configured as a circular array;
the AC light source further comprising a body to which the circuit board is mounted in thermal communication therewith; and
a connector for connecting the light source to an AC supply.

* * * * *